(12) United States Patent
Wang et al.

(10) Patent No.: US 10,007,235 B2
(45) Date of Patent: Jun. 26, 2018

(54) TIME-TO-DIGITAL CONVERTER WITH PHASE-SCALED COURSE-FINE RESOLUTION

(71) Applicant: Microsemi Semiconductor ULC, Kanata (CA)

(72) Inventors: Tuoxin Wang, Kanata (CA); John William Mitchell Rogers, Nepean (CA); Krste Mitric, Ottawa (CA); Guohui Situ, Kanata (CA)

(73) Assignee: Microsemi Semiconductor ULC, Kanata, ON (CA)

( * ) Notice: Subject to any disclaimer, the term of this patent is extended or adjusted under 35 U.S.C. 154(b) by 0 days. days.

(21) Appl. No.: 15/711,012

(22) Filed: Sep. 21, 2017

(65) Prior Publication Data

US 2018/0088535 A1 Mar. 29, 2018

Related U.S. Application Data

(60) Provisional application No. 62/398,693, filed on Sep. 23, 2016.

(51) Int. Cl.
*H03M 1/12* (2006.01)
*G04F 10/00* (2006.01)
(Continued)

(52) U.S. Cl.
CPC ......... *G04F 10/005* (2013.01); *H03M 1/1009* (2013.01); *H03M 1/125* (2013.01); *H03M 1/502* (2013.01)

(58) Field of Classification Search
CPC .. H03M 1/1215; H03M 1/1009; H03M 1/502; H03M 1/1038; H03M 1/1052;
(Continued)

(56) References Cited

U.S. PATENT DOCUMENTS

| | | | | |
|---|---|---|---|---|
| 2009/0256601 | A1* | 10/2009 | Zhang | H03L 7/085 327/156 |
| 2009/0273384 | A1* | 11/2009 | Kojima | H03K 5/131 327/262 |

(Continued)

OTHER PUBLICATIONS

R. B. Staszewski et al., "All-Digital Frequency Synthesizer in Deep-Submicron CMOS", Wiley (2006).
(Continued)

*Primary Examiner* — Linh Nguyen
(74) *Attorney, Agent, or Firm* — Simon Kahn

(57) ABSTRACT

A time-to-digital converter (TDC) measures a time interval $\Delta T_{Tot}$ between a leading signal and a triggering signal. A phase regulator incorporates a looped delay line to create pre-defined sub-intervals $T_{NOR}$ determined by the length of the delay line. The phase regulator has an input receiving the leading signal such that the leading signal loops around the delay line. A counter for counting the number of times m the leading signal loops around the delay line before said triggering signal arrives to obtain a coarse measurement of the time interval defined in terms of the sub-intervals $T_{NOR}$. A Vernier core for measures a residual time interval $T_R$ where $T_R = \Delta T_{Tot} - mT_{NOR}$ to obtain a value for the time interval $\Delta T_{Tot}$. The TDC uses simpler encoding logic with reduced power consumption and phase noise performance better than 5 dB.

20 Claims, 6 Drawing Sheets

(51) Int. Cl.
*H03M 1/10* (2006.01)
*H03M 1/50* (2006.01)

(58) Field of Classification Search
CPC ........ H03M 1/50; H03M 1/52; H03M 1/1014;
H03M 1/12; H03M 1/1225; H03M 1/58;
H03M 1/68; H03M 3/354; H03M 3/424
USPC .......................................... 341/118, 120, 155
See application file for complete search history.

(56) References Cited

U.S. PATENT DOCUMENTS

| | | | | |
|---|---|---|---|---|
| 2009/0322574 | A1* | 12/2009 | Rivoir | G04F 10/005 341/120 |
| 2011/0267120 | A1* | 11/2011 | Ravi | H03L 7/1978 327/159 |
| 2012/0056769 | A1* | 3/2012 | Wang | G04F 10/005 341/166 |

OTHER PUBLICATIONS

B. Wang et al., "A Digital to Time Converter with Fully Digital Calibration Scheme for Ultra-Low Power ADPLL in 40 nm CMOS", ISCAS, p. 2289-2262 (2010).
T. H. Lee, "The Design of CMOS Radio-Frequency Integrated Circuit", Cambridge University Press, Cambridge (first published 1998).
J. W. M. Rogers et al., "Radio Frequency System architecture and design", Artech House, 4-6:129-262 (2013).
B. Razavi, "Phase-Locking in High-Performance Systems: From Device to Architectures", Wiley-IEEE Press (2013).
S. Henzler, "Time-to-Digital Converter", Springer (2009).
W. Altabban et al., "Merged Digitally Controlled Oscillator Symposium on Circuits and Systems", p. 1987-1990 (2010).
M. Z. Straayer et al., "An efficient high-resolution 11-bit noise-shaping multipath gated ring oscillator TDC", Digest of the International Symposium on VLSI Circuits, p. 82-83 (Jun. 2008).
P. Dudek et al., "A high-resolution CMOS time-to-digital converter utilizing a Vernier delay line", IEEE J. Solid-state Circuit, 35(2):240-247 (Feb. 2000).
L. Vercesi et al., "Two-Dimensions Vernier Time-to-Digital Converter", IEEE J. Solid-state Circuit, 45(8):1504-1512 (Aug. 2010).
R. B. Staszewski et al., "All-digital phase-domain TX frequency synthesizer for blue tooth radions in 0.13um CMOS", IEEE Int. Solid-State Circuits Conf. (ISSCC) Dig. Tech. Papers, 1:272-527 (Feb. 2004).
R. B. Staszewski et al., "1.3v 20ps Time-to-digital Converter for Frequency Synthesis in 90-nm CMOS", IEEE Tran. on Circuits and Systems II express briefs, 53(3):220-224 (Mar. 2006).
J. Yu et al., "A 12-Bit Vernier Ring Time-to-Digital Converter in 0.13um CMOS Technology", IEEE J. Solid-state Circuit, 45(4):830-842, (Apr. 2010).
P. Lu et al., "A 3.6umW 90nm CMOS Gated-Vernier Time-to-Digital Converter with an Equivalent Resolution of 3.2ps", IEEE J. Solid-state Circuit, 47(7):1623-1635 (Jul. 2012).
M. Lee et al., "A 9b, 1.25ps resolution coarse-fine time-to-digital converter in 90nm CMOS that amplifies a time residue", Digest of the International Symposium on VLSI Circuits, p. 168-169 (Jun. 2007).
A. Samarah et al., "A Digital Phase-Locked Loop With Calibrated Coarse and Stochastic Fine TDC", IEEE J. Solid-state Circuit, p. 1829-1841 (2013).
M. Rabaey et al., "Digital Integrated Circuit", Pearson (2011).
N. H. E. Weste et al., "CMSO VSLI Design: A Circuits and Systems Perspective", Pearson (2011).
Roland E. Best, Phase-Locked Loops: Design, Simulation and Applications, McGraw-Hill (2003).
J. Shen et al., "Phase noise improvement and noise modeling of type-I ADPLL with non-linear quantization effects", NORCHIP, p. 1-4 (2014).

* cited by examiner

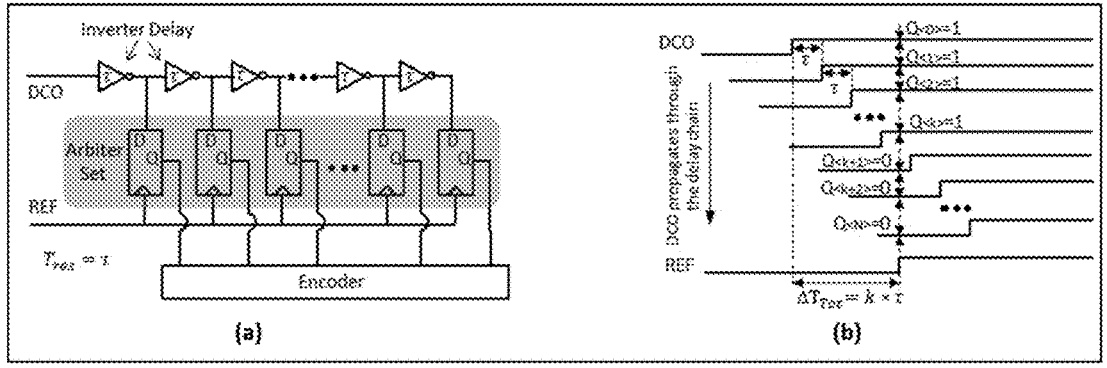
Fig. 1a     PRIOR ART     Fig. 1b
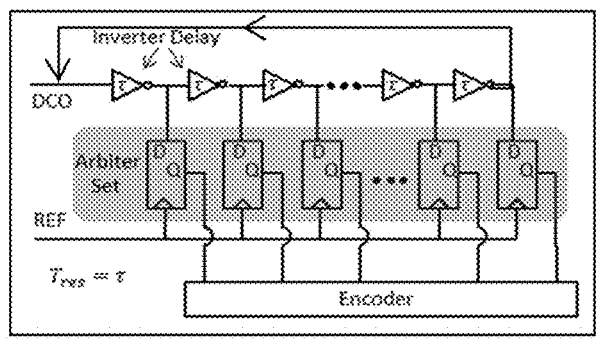
Fig. 2     PRIOR ART
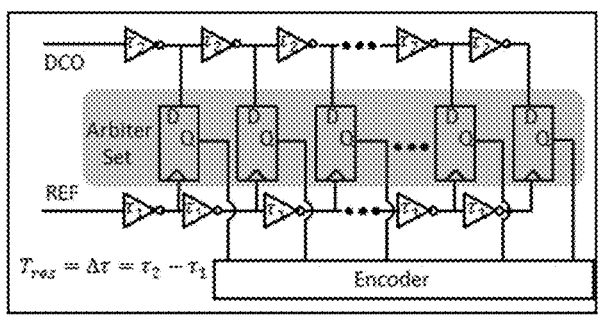
Fig. 3     PRIOR ART

TIME-TO-DIGITAL CONVERTER WITH PHASE-SCALED COURSE-FINE RESOLUTION

CROSS REFERENCE TO RELATED APPLICATION

This application claims the benefit under 35 USC 119(e) of U.S. Provisional Application No. 62/398,693, filed Sep. 23, 2016, the contents of which are herein incorporated by reference.

FIELD OF THE INVENTION

This invention relates to the field of precision time measurement, and in particular to a precision time-to-digital converter.

BACKGROUND OF THE INVENTION

Time-to-Digital converters (TDCs) convert time intervals into a digital representation. There is a practical limit on the frequency of a master clock that can be used to measure time intervals. TDCs are primarily concerned with measuring time intervals between clock pulses of a master clock so as to offer a resolution better than would determined by the period of the master clock alone. TDCs have a number of applications, for example, in the field of particle physics, but an important application is the all-digital phase-locked loop (ADPLL), where they are used as phase detectors. Increasing demands in this field, in particular for wireless applications, such as mobile phones, Bluetooth, wireless LAN etc., call for TDCs with time resolutions in the order of picoseconds (ps). This is smaller than the clock period of the highest frequency practical clocks, so some method of interpolation must be employed to subdivide a clock period into smaller time intervals.

ADPLL designs should cover the frequency range from sub-100 MHz to 20 GHz (or even broader), which requires a wide phase detection range of tens of ns. It means that the TDC phase detection range needs to cover (not less than) the period of the lowest frequency of the DCO. Therefore, a fine TDC time resolution combined with a wide phase detection range is the most important performance specifications in most wireless applications. The other way to digitally express the phase detection range of a TDC is by how many output bits it produces. For instance, a 10 bit TDC with 2 ps resolution is able to detect 2 ns of the phase detection range, while a 14 bit TDC can cover more than 32 ns. In the case of a fixed number of digital bits, the phase detection range gets narrower with the finer TDC time resolution, which means that a TDC design must trade-off time resolution for phase detection range, or vice versa. Parameters such as area, power consumption and reliability are also important for assessing the TDC's overall performance.

One prior art technique is to use a digital delay line consisting of a chain of inverter delay elements as shown in FIG. 1a. The delay elements divide one clock interval into a series of small time intervals. Delayed versions of a leading signal are sampled in parallel along the delay line. The DCO input represents the leading signal, which serves as a start signal and the REF input serves as the triggering signal. The TDC measures the time interval between the leading signal and the triggering signal.

Coincidence with the triggering signal is detected by a chain of D flip-flops. The D flip-flops capture the value of the D-input at a definite portion of the clock cycle (e.g. the rising edge of the clock or falling edge). An odd number of D flip-flops are triggered by the falling edge; an even number of D flip-flops are triggered by the rising edge. That captured value becomes the Q output.

As shown in FIG. 1b, when the triggering signal transitions from low to high the Q outputs of the flip-flops are latched to the input value. The leading signal appears inverted at the output of the first inverter and the D-input of the first flip-flop after a first delay. Similarly, the leading signal appears uninverted at the output of the second inverter and the D-input of the first flip-flop after a second delay. As soon as the triggering signal goes high, the Q output of the flip-flops will follow their respective D-inputs, giving a sequence of ones and zeros at the input to the decoder which represents the time difference between the low to high transition of the leading to the triggering signal as shown in FIG. 1b. This results in a thermometer code because all the delay stages that have been passed by the leading signal, prior to the transition of the reference signal, give a high value output, when corrected for the number of inversions, whereas the delay stages that have not been passed by the leading signal will have a low value output when corrected for the number of inversions. The position of the high-low transition indicates how far the leading signal could propagate during the time interval spanned by the leading and triggering signals.

An alternative arrangement, shown in FIG. 2, is to employ a ring oscillator consisting of k delay stages. The ring oscillator has a better phase detection range because leading signal can run multiple times through the ring before triggering signal arrives, therefore making it in theory to support infinite detection range; requires a small chip area because of the limited number of delay elements; and has a lower power consumption than the digital delay line because of the fewer components, but still suffers from poor phase noise performance because the resolution is limited to the delay of one delay element, typically 16 ps.

Both the digital delay line and ring oscillator TDCs have relatively coarse time resolution. An improvement can be realized by modifying the digital delay line to employ the Vernier principle. In a conventional Vernier instrument, a Vernier scale is set along side a main scale, where the Vernier scale spacing is a fraction of the main scale spacing. Typically ten graduations of the Vernier scale correspond to nine graduations of the main scale. This means that if the starting graduation on the Vernier scale is aligned with a graduation on the main scale, the second Vernier graduation will be offset by $1/10^{th}$ of the main scale, the third by $2/10$ ths and so on until the tenth, which will align with the $9^{th}$ graduation on the main scale. Alternatively, if the first Vernier graduation is aligned somewhere between graduations on the main scale, the first coincidence between the Vernier scale graduation and the main scale graduation will indicate the fraction of the graduations on the main scale where the first Vernier graduation is located.

A similar principle can be employed in the time domain by using two delay lines with slightly different delays. In this case the clock edges constitute the graduations. If the Vernier delay line with a slightly different delay is started when a triggering event occurs between two main clock edges, the next time a coincidence occurs between a Vernier clock edge and a main clock edge will give a measure of the fractional distance of the event between the main clock edges that is dependent on the difference in delays of the two delay lines.

Such a TDC is shown in FIG. 3, where the time resolution $T_{res}$ is given by the expression $T_{res} = \Delta T = \tau_2 - \tau_1$, where $\tau_2$ represents the per inverter delay for the leading signal and $\tau_1$ represents the per inverter delay for the trigger signal. While offering a fine resolution, this arrangement has a narrow phase detection range, requires a large chip area and has high power consumption.

The Vernier delay-line TDC can be improved by looping the two delay lines to create a fast and slow ring as shown in FIG. 4. This strategy improves the phase detection range, and moderately reduces the required chip area and power consumption. The chip area and power consumption however remain a significant factor. One example of such a TDC is described in U.S. Pat. No. 8,138,958, the contents of which are herein incorporated by reference.

SUMMARY OF THE INVENTION

Embodiments of the invention split phase (time) measurement into coarse, and fine regions, or coarse, moderate, and fine regions. Only a short phase length (tens of ps) requires a fine-resolution measurement while the rest of the phase length (tens of ns) can be measured and counted in coarse graduations by a phase regulator and normal-phase counter. The phase regulator and normal-phase counter divide the time interval to be measured $\Delta T_{tot}$ into defined sub-intervals $T_{NOR}$ and determine the number of such sub-intervals. The remaining interval $T_R$, which is a fraction of the defined sub-interval $T_{NOR}$, is quantized by a fine-resolution Vernier core. It will be appreciated that phase difference is measured as a time interval, so time and phase can be considered essentially the same for the purposes of this explanation.

According to the present invention there is provided a time-to-digital converter (TDC) for measuring a time interval $\Delta T_{Tot}$ between a leading signal and a triggering signal, comprising a phase regulator incorporating a looped delay line to create pre-defined sub-intervals $T_{NOR}$ determined by the length of said delay line, said phase regulator having an input receiving said leading signal whereby said leading signal loops around said delay line; a counter for counting the number of times m said leading signal loops around said delay line before said triggering signal arrives to obtain a coarse measurement of said time interval defined in terms of said sub-intervals $T_{NOR}$; and a Vernier core for measuring a residual time interval $T_R$ where $T_R = \Delta T_{Tot} - mT_{NOR}$ to obtain a value for the time interval $\Delta T_{Tot}$.

When compared with a Vernier-ring TDC consisting of the same number of delay elements, embodiments of the invention make the encoding of the phase measurement simpler due to the fact that only the number of passes of the leading signal through the looped delay line need to be counted. This can be done in a simple counter, whereas in the prior art it was necessary to save the state of entire ring in internal memory for every pass through the ring so as to permit the state of the memory to be determined when the triggering signal arrived. By contrast, in the present invention the simple counter counts the number of passes through the ring, making it necessary only to encode that state of one pass, which is the last pass before the triggering signal arrives. To save all these states (and there can be many depending on how large a phase detection range is supported, i.e. how many times the signal passes through the ring before the triggering signal arrives), a large amount of internal memory that operates at high speed is required. This is very costly from chip area and power perspective.

Moreover, with a prior art Vernier ring it is not easy to detect whether the pass is odd or even pass, requiring additional detection complexity or double the number of elements (half for odd and half for even passes), which again implies a larger area. As a result, Vernier ring structures typically run at s lower reference speed, which allows the present invention to gain a couple of dB (2 to 3) by simply running at higher reference frequencies.

In addition to allowing simple encoding logic, and therefore lower area and power implementation, embodiments of the invention can support higher reference frequencies for a given technology, directly contributing to better system performance by over 5 dB.

In one embodiment the phase regulator can be combined with an arbiter to play a secondary role as a moderate resolution TDC. Such an embodiment can offer a 3-level (coarse/moderate/fine) resolution. The power consumption can be reduced by an order of magnitude compared to a conventional Vernier ring TDC.

Embodiments of the invention make use of an RRD (reference-retimed-by-DCO) signal as the triggering signal and the reference signal itself as the leading signal. The edge of the RRD signal always occurs after the edge of the REF signal, so it can be used as the trigger signal. This avoids the need for an extra logic circuit that is required for traditional TDC solutions that do not make use of the RRD signal to identify which signal comes first and which signal comes second, and then to route first signal as data and route second signal as trigger data.

TDCs in accordance with the invention may include a coordinated-determination evaluator to make the final arithmetic determination of moderate resolution output (QM) and the fine resolution output (QR) simpler and faster. The coordinated-determination evaluator also separates true transitions from fake transitions.

In one embodiment the invention offers flexible switching between three-step (coarse/moderate/fine) time resolution configurations in the TDC in order to meet differing requirements in a single device.

According to another aspect of the invention there is provided a method of obtaining a digital representation of a time interval $\Delta T_{Tot}$ between a leading signal and a triggering signal, comprising creating pre-defined sub-intervals $T_{NOR}$ with a looped delay line; looping said leading signal through said looped delay line until a triggering signal arrives; counting the number of times m said leading signal loops around said delay line before said triggering signal arrives to obtain a coarse measurement of said time interval defined in terms of said sub-intervals $T_{NOR}$; and measuring a residual time interval $T_R$ where $T_R = \Delta T_{Tot} - mT_{NOR}$ with a Vernier core to obtain a value for the time interval $\Delta T_{Tot}$.

BRIEF DESCRIPTION OF THE DRAWINGS

This invention will now be described in more detail, by way of example only, with reference to the accompanying drawings, in which:

FIG. 1a is a schematic diagram a prior art time-to-digital converter (TDC) employing an inverter-based digital delay line;

FIG. 1b is a timing chart for the TDC shown in FIG. 1a;

FIG. 2 is a schematic diagram of a prior art ring-oscillator TDC;

FIG. 3 is a schematic diagram of a prior art Vernier TDC;

DETAILED DESCRIPTION OF PREFERRED EMBODIMENTS

Figure 4:
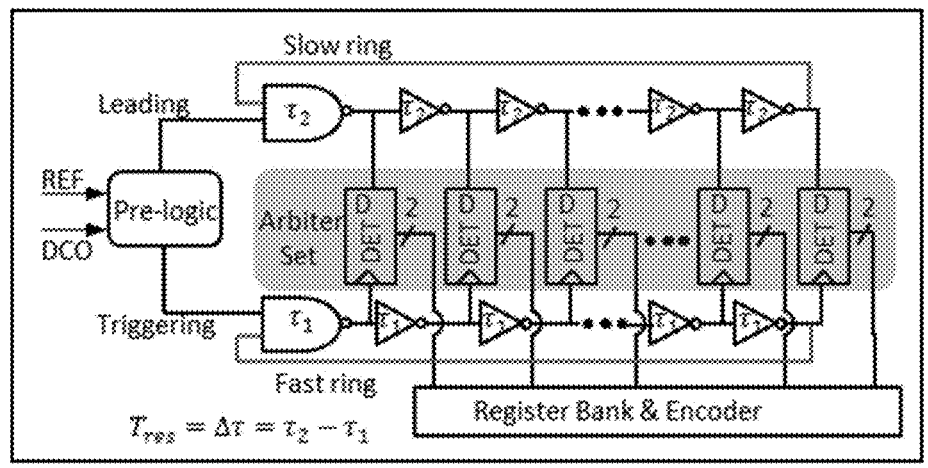
FIG. 4 is a schematic diagram of a prior art Vernier ring TDC.
Figure 5:
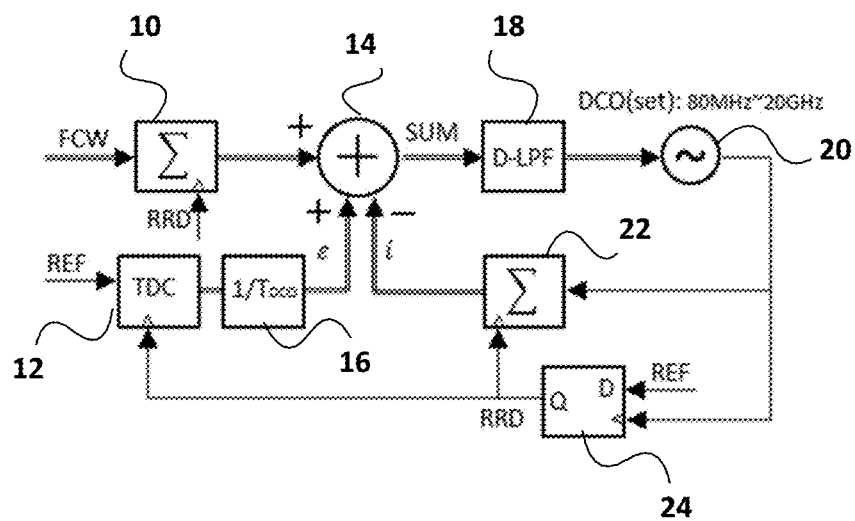
FIG. 5 is a schematic diagram of a typical digital PLL.

FIG. 5 is a schematic diagram of a typical digital phase-locked loop (DPLL). The accumulator 10 receives a frequency control word FCW as one input and a reference-retimed-by DCO input (RRD) from TDC 12, which compares the output of the DPLL with a reference source REF. The generation of the RRD signal is described below. The remaining components of the DPLL are the adder 14, divider 16, digital low pass filter 18, digitally controlled oscillator 20, accumulator 22, and flip-flop 24. The digital PLL ideally requires the TDC 12 to perform over a wide phase (time) detection range, have a fine resolution, have a low power consumption while occupying a compact chip area, and allow for a high reference frequency REF.

Figure 6:
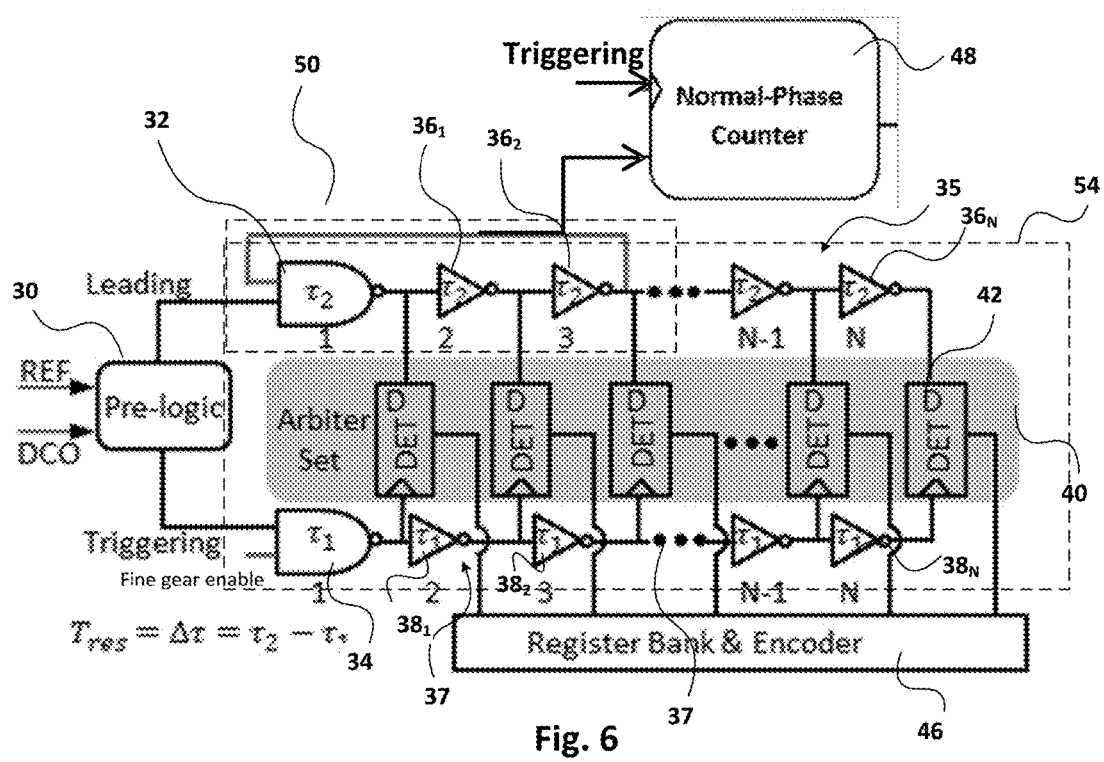
FIG. 6 is a schematic diagram of a phase-scaled Vernier TDC in accordance with one embodiment of the invention.
Figure 7:
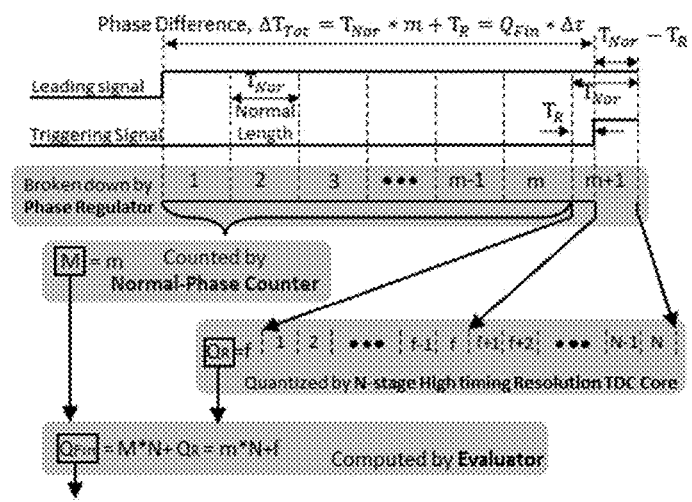
FIG. 7 is a timing diagram showing the way in which the phase (time) is sliced up in accordance with the invention.

FIG. 6 illustrates the principles of a phase-scaled Vernier TDC in accordance with a basic embodiment of the invention. This embodiment employs a partial-ring in a slow delay chain 35. A pre-logic input module 30 receives as inputs a digitized reference signal REF from a master clock and an output DCO from the digital controlled oscillator 20. The pre-logic module 30 receives REF and DCO signals as inputs, and outputs a leading signal and a triggering signal as shown in FIG. 7. In this example the leading and triggering signals go high at the transition edge of the REF and DCO signals. The ultimate objective is to determine the time interval between the transition edges of the REF and DCO signals.

The leading signal is applied to one input of NAND gate 32. The triggering signal is applied to one input of NAND gate 34 and to an input of normal phase counter 48.

The output of the NAND gate 32 is coupled to a chain 35 of inverter delay elements $36_1, 36_2 \ldots 36_N$, each introducing a delay $\tau_2$. The output of NAND gate 34 is applied to a chain 37 of inverter delay elements $38_1, 38_2 \ldots 38_N$, each introducing a delay $\tau_1$. It should be noted that the NAND gates 32, 34 also act as delay elements, introducing respective delays $\tau_2$ and $\tau_1$, typically 10 ps~40 ps.

An arbiter 40 comprising respective D flip-flops 42 is arranged between the chains 35 and 37. The chains 37 and D flip-flops 42 form an N-stage fine resolution Vernier TDC core 54.

The Q outputs of the D flip-flops 42 are coupled to register bank and encoder 46, which provides the output representing the time difference between the leading and triggering signals as a thermometer code. It will be noted that the second input to the NAND gate 32 is taken from a point part-way down the chain 35, in this example, after the second inverter delay element $36_2$. The second input to the NAND gate 34 is decoupled from the output of the chain 37, and acts as a fine-resolution enable input as will be described in more detail below.

In this exemplary embodiment the first three delay elements, NAND gate 32 and inverters $36_1$ and $36_2$ form a looped delay line in the form of a ring structure with a $3\tau_2$ delay. The objective is to determine the delay between the leading signal and the triggering signal, given that the delay is likely to be less than the clock period of the master clock (REF). As shown in FIG. 7, the time interval or phase difference between the leading signal and the triggering signal is $\Delta T_{Tot}$. In accordance with embodiments of the invention this period $\Delta T_{Tot}$ is broken up into a series of pre-defined sub-intervals, referred to herein as normal intervals, of length $T_{Nor}$ plus a residual interval $T_R$.

In FIG. 6 the sub-interval $T_{Nor}$ is defined by the phase regulator 50 comprising the three delay elements 32, $36_1$ and $36_2$. The leading signal is looped through an odd number of delay elements, in this example delay elements 32, $36_1$ and $36_2$, each time incrementing the normal-phase counter 48 until the triggering signal occurs, at which point the normal phase counter stops incrementing. The count m in the phase counter 48 gives a coarse measure of the time interval $\Delta T_{Tot}$ based on the number of normal intervals that have passed when the triggering signal occurs without regard to the residual interval $T_R$. The resolution of the output of the normal-phase counter 48 is the length of the delay line comprising delay elements 32, $36_1$ and $36_2$.

The remaining task is to find the value of the residual interval $T_R$. This is achieved by the N-stage Vernier core 54. As the normal-phase counter 48 increments the enable signal input is asserted on the fine gear enable input of the NAND gate 34. The triggering signal propagates along the chain 37 consisting of delay elements 34, $38_1 \ldots 38_N$, each with a delay $\tau_1$. As the leading signal re-enters the chain 37 after each pass through the three delay elements 32, $36_1$ and $36_2$, corresponding together to the sub-interval $T_{Nor}$, coincidence of the edge of the leading signal and the triggering signal as detected by the flip-flops 42 will give the fraction of the period $T_{Nor}$ in which the triggering signal occurs, or in other words $T_R$.

The contents of the register 46 at the instant of coincidence give $T_R$ in a similar manner to a conventional Vernier TDC core except that in this case the reference point is the start of an interval $T_{Nor}$, rather than an edge of the master clock pulse, namely the leading signal. The total time $T_{tot}$ is then given by the expression $\Delta T_{tot} = T_{Nor} \times m + T_R$, where m is the count in counter 48, namely the number of times the leading edge has looped through the phase regulator 50.

The value of N should be picked so as to allow the fine resolution Vernier TDC to just cover the normal-length sub-interval, $T_{NOR}$. That means:

$$N = \frac{T_{Nor}}{T_{res}} = \frac{T_{Nor}}{\Delta \tau}$$

where Tres is the desired resolution and $\Delta \tau$ is the difference in delays $\tau_2 - \tau_1$, of the slow and fast chains 35, 37.

For instance, if $T_{NOR}$ is set to be 60 ps and the desired resolution equals 5 ps, N should be 12. The output of the Vernier TDC ($Q_R$) is:

$$Q_R = T_R / \Delta \tau$$

where the value of $Q_R$ is between 0 and N.

The total delay $\Delta_{Tot}$ is then given by the expression;

$$\Delta T_{Tot} = M \cdot N \cdot \Delta \tau + Q_R \cdot \Delta \tau = (M \cdot N + Q_R) \cdot \Delta \tau$$

Figure 8:
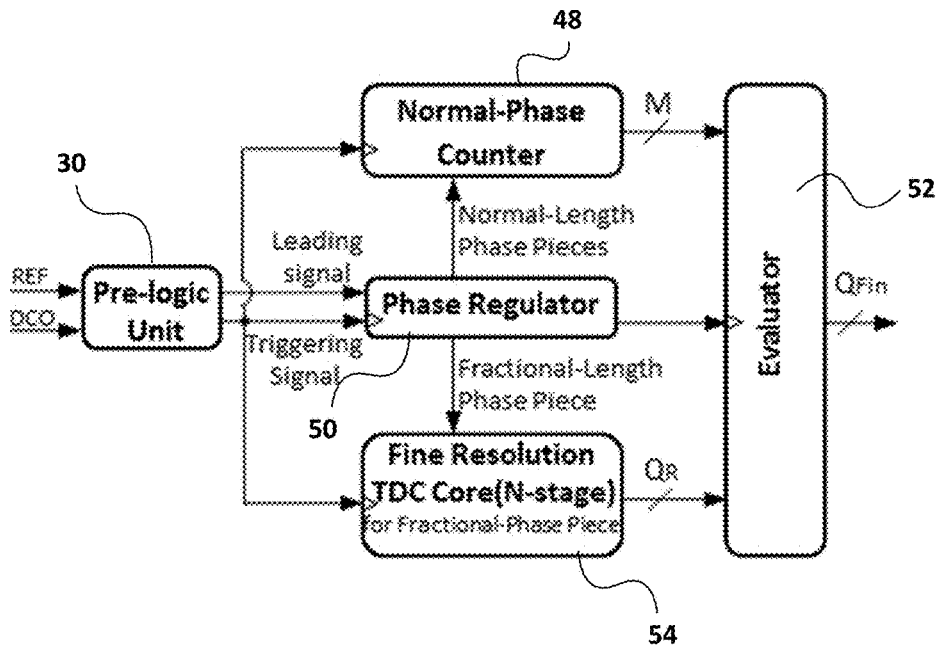
FIG. 8 is an equivalent diagram of a TDC in accordance with an embodiment of the invention.

This basic concept is illustrated in FIG. 8. The pre-logic module 30 generates the leading and triggering signals from the inputs REF and DCO coming respectively from a master clock and the DCO 20 of a DPLL. The leading signal is applied to the phase regulator 50. The triggering signal is applied to the normal-phase counter 48, the phase regulator 50, and the Vernier TDC core 54.

As previously noted, the count in the normal-phase counter 48 gives a coarse measure determined by the interval $T_{NOR}$ of the time interval $\Delta T_{tot}$. The interval $T_{NOR}$ is determined by the length of the phase regulator 50. The fine resolution TDC core 54 provides the fractional interval $T_R$, which is represented by a binary number output by the register bank and encoder 46. The evaluator 52 collates the information from the three sources 48, 50, 54 and produces a final output representing the total time $T_{tot}$ between the leading and triggering signals in the form of an output word $Q_{Fin}$.

Figure 9:
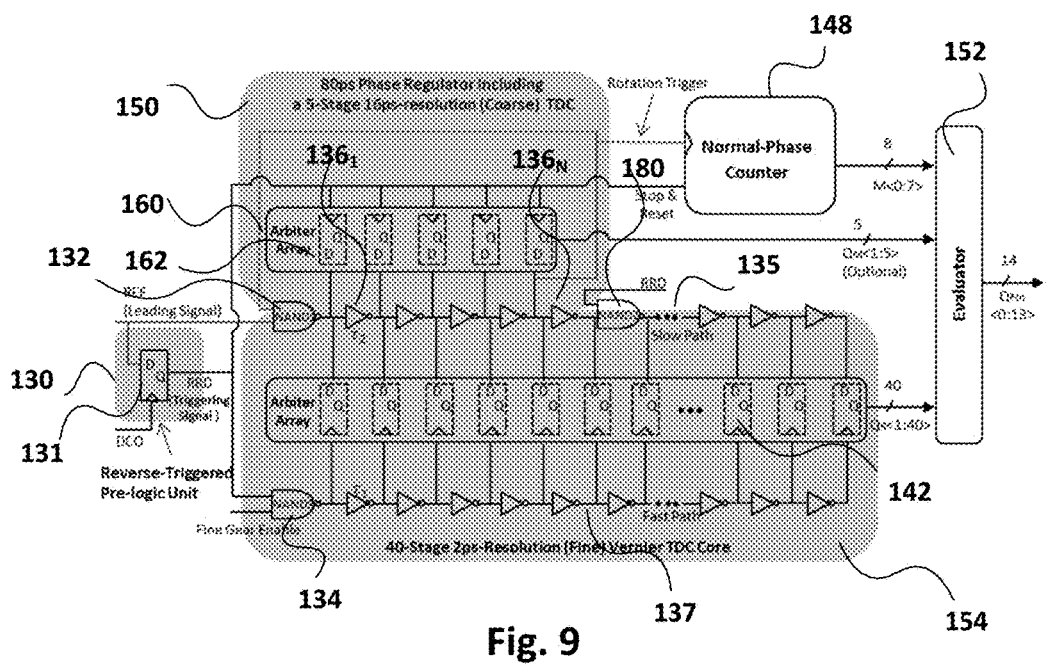
FIG. 9 is a schematic diagram of a second embodiment of the invention.

An alternative embodiment, which offers a 3-level switchable coarse/moderate/fine resolution, is shown in FIG. 9. In this embodiment the pre-logic module 130, which comprises a D flip-flop 131, outputs the leading signal to a phase regulator 150 forming a 5-stage 16 ps-resolution TDC core with a total delay of 80 ps. It should be noted that this embodiment employs RRD (reference-retimed-by-DCO) as the triggering signal and the reference signal itself as the leading signal.

The phase regulator 150 comprises a separate arbiter array 160 comprising a chain of D flip-flops 162 and a sub-set of delay elements $136_1 \ldots 136_N$ of the delay chain 135. The last delay element $136_N$ of the subset is followed by a NAND gate 180, which also serves as a delay element, that receives at its inputs the output of the last delay element $136_N$ and the reference-retimed-by DCO (RRD) signal from pre-logic module 130 (described below) for achieving moderate resolution. In the moderate resolution mode the period $T_{NOR}$ is separated into five regions. The leading signal is applied to the phase regulator 150, which forms a 5-stage 16 ps resolution ring structure, and loops through in the same manner as shown in FIG. 6, with the number of rotations being counted by the normal-phase counter 148.

In addition this embodiment comprises a 40-stage 2 ps resolution Vernier TDC core 154 comprising delay chains 135, 137 and flip-flops 142. The respective delay chains have incremental delays $\tau_2$ and $\tau_1$.

The normal-phase counter 148 offers an 80 ps resolution defined by the length of the phase regulator 150 comprising NAND gate 132 and delay elements $136_1 \ldots 136_N$. In this mode the measured time interval is determined by the count in the normal-phase counter 148, which is output as an 8-bit word, M.

The core circuit comprising NAND gate 132 and delay elements $136_1 \ldots 136_N$ acts as a ring oscillator TDC giving a resolution of 16 ps, namely the delay introduced by each stage. This additional interval, namely the location within $T_{NOR}$ to a resolution equal to the delay of each stage of the delay chain, is output as a 5-bit word $Q_M$. Finally, with the 40-stage Vernier TDC core 154 enabled by fine gear enable input to NAND gate 134, the embodiment shown in FIG. 9 offers a 2 ps resolution output as a 40-bit word $Q_R$. The alternative modes allow the user to choose between higher resolution performance and lower power consumption.

In this embodiment the rising edge of the leading signal (REF) enables the NAND gate 132, launching the run of the leading signal along the ring oscillator 132, $136_1 \ldots 136_N$.

The other input terminal of NAND gate 132 is high already. The leading signal starts travelling in the loop of the ring oscillator and it triggers the counting of the normal-phase counter 148 each time it completes a rotation (passes the last stage of the loop). The propagation along the ring will not stop until the triggering signal (RRD) appears. The counter 148 can tell how many rotations (M) of the leading signal has experienced around this ring structure. The time period of a single rotation around the ring is actually the normal-length phase ($T_{Nor}$), which is set to be 80 ps in this case. The number of the stages of the phase regulator can be 3 or 5 or 7 (odd) to make ring oscillator work correctly and efficiently. In this non-limiting example, the number of delay stages of the ring oscillator ($N_{ring}$) is set to 5. The propagation delay of each stage of the inverter in the phase regulator ($\Delta t\_ring$) can be found from the expression:

$$\Delta t_{ring} = \frac{T_{Nor}}{N_{ring}} = \frac{80 \text{ ps}}{5} = 16 \text{ ps} = \tau_2$$

In this case the delay $\tau_2$ equals to $\Delta t_{ring}$.

The Vernier core 154 is not used during most of the phase detection operation, and is only used to measure the last fractional piece, $T_R$. The arrival of the triggering signal (RRD) is used not only to start the run of the RRD signal along the fast path delay chain 137 but also to activate the sixth stage of the inverter in the slow path delay chain 135. The signal RRD controls NAND gate 180. At this point the triggering signal starts chasing the leading signal, and the position where the triggering signal just catches up with the leading signal is indicated by the transition of the arbiters' output $Q_R$. The number of stages of the Vernier TDC core (N_core) 154 is determined by the desired normal-length phase and the desired resolution:

$$N_{core} = \frac{T_{Nor}}{\Delta \tau} = \frac{80 \text{ ps}}{2 \text{ ps}} = 40$$

The slow-path 135 inverter delay ($\tau_2$) and the fast-path 137 inverter delay ($\tau_1$) should be equal to 16 ps and 14 ps respectively. The final TDC output $Q_{Fin}$ can be determined by acquired the M, N=40 and $Q_R$.

Compared to the Vernier Ring TDC solution where two arrays of arbiters are needed for odd-rotation and even-rotation respectively, this solution only needs one array of arbiters due to the ring-less structure of the fast path. This means that the complexity of a 40-stage Vernier core in this solution is actually equivalent to that of a 20-stage Vernier ring solution.

Because the completion of the odd rotation corresponds to the falling edge of the input signal of the normal-phase counter and even rotation corresponds to the rising edge, the phase counter 148 should be a both-edge triggered counter to record each rotation of the signal. According to the phase detection range of 12.5 ns and 80 ps for $T_{Nor}$, the phase counter 148 may record 156 rotations maximum. Thus, an 8 bit normal-phase Counter, which has a maximum count of 256, is sufficient.

Figure 10:
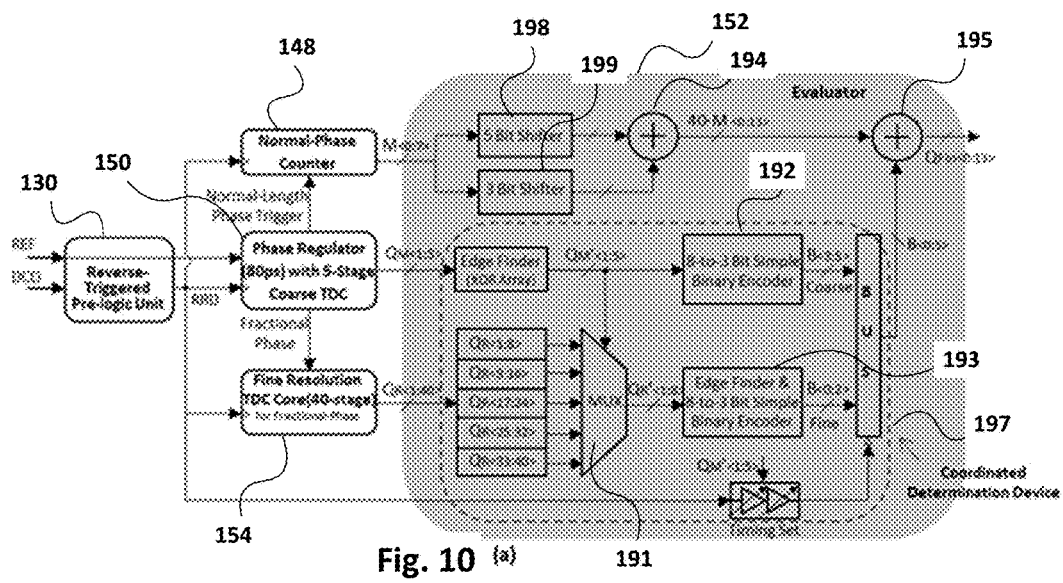
FIGS. 10a and 10b are block diagram and a timing chart illustrating the operation of the embodiment shown in 9.
Figure 10:
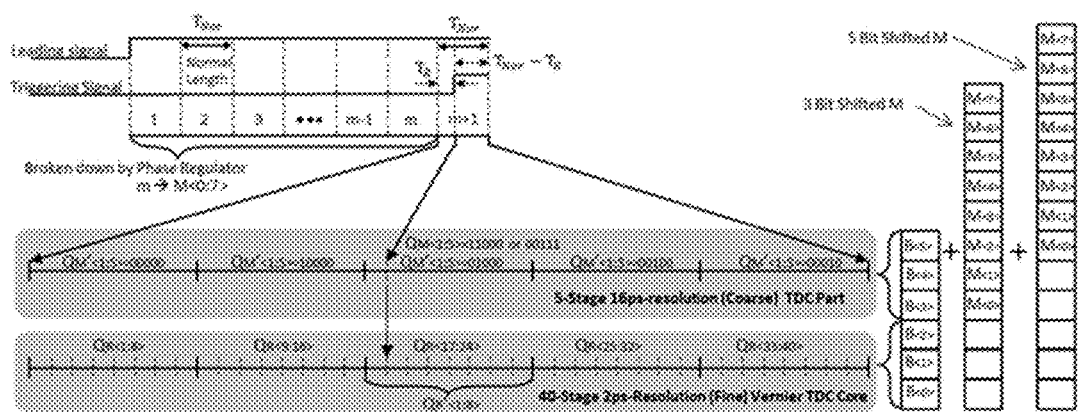

A block diagram of this embodiment as well as a timing chart illustrating the operation are shown in FIGS. 10a and 10b. The pre-logic module 130 outputs the RRD signal to the normal phase counter 148, the phase regulator 150, and the fine TDC core 154.

FIG. 10a shows more details of the evaluator 52. The evaluator 52 calculates the output of the normal-phase counter, M (the number of normal length phase pieces between phase difference) and the output of the Vernier core unit in thermometer-code format ($Q_R$<1:40>) which is determined by the equation $Q_R=T_R/\Delta \tau$. Thus $Q_{Fin}$ for a 40 stage fine TDC core is determined by the expression:

$$Q_{Fin}=M \cdot 40+Q_R$$

Usually a 40/6 bit thermometer-to-binary encoder is employed to convert $Q_R$ from thermometer code to binary code. The complexity of the thermometer-to-binary encoder increases exponentially with the digit number of thermometer code; although it is already much simpler than that of a priority type decoder, which is commonly used in a Vernier Ring TDC due to the possibility of the presence of multiple fake transitions. However, a 40/6 bit thermometer-to-binary encoder is still viewed as a complicated conversion and deserving of further simplification into an 8/3 bit simple encoder by applying the coordinated-determination device in the evaluator.

As shown in FIG. 10a, $Q_M<1:5>$ is the output of the arbiter 160 located in the phase-regulator (5-stage ring-oscillator), that actually can be regarded as the arbiter of a ring-oscillator TDC. The setting of $T_{Nor}$ (normal-length phase) of 80 ps is covered by a 5-stage ring-oscillator with a propagation delay of each stage at 16 ps (i.e. coarse resolution); also covered by a 40 stage Vernier TDC core with 2 ps resolution (fine resolution). $Q_M<1:5>$ and $Q_R<1:40>$ indicate the quantitative measurement value of $T_R$ with 16 ps and 2 ps resolution respectively. Each bit in $Q_M<1:5>$ sequentially corresponds to eight bits in $Q_r<1:40>$ as shown in FIG. 10b. In the evaluator 152, the exact position of the transition can be determined by the following steps:

a) First $Q_M<1:5>$ passes through an array of XOR gates 190 (a)) to find the position of its values' transition (transferring the thermometer code format of data to simple code format $Q'_M<1:5>$). $Q_R<1:40>$ can be distributed into five sections, which correspond to $Q'_M<1>~Q'_M<5>$.
b) Second, the exclusive bit of "high" in $Q'_M<1:5>$ is used to select through multiplexer 191 the corresponding section of $Q_r<1:40>$ which should be the section that contains the position of the edge transition in higher precision (labeled $Q'_r<1:8>$).
c) Third, $Q'_M<1:5>$ is converted by a simple 8/3 encoder 192 into a three bit output, B<3:5> which represents the three most significant bits of a 6 bit binary number which shows the effective remaining phase difference ($T_R$) in coarse resolution of 16 ps.
d) Meanwhile, $Q'_r<1:8>$ is converted by an edge finder and a simple 8/3 encoder 193 into a three bit output, B<0:2>, which represents the three least significant bits of the above mentioned 6 bit binary number to exhibit the fine part of $T_R$ in 2 ps resolution.
e) The key point is the 3-bit output of the coarse-detection (B<3:5>) from arbiters of the phase regulator can be just easily stacked onto the 3-bit of the fine-detection (B<0:2>), avoiding additional computation and conversion, provided the equation $N_{core}/N_{ring}=2^K$ holds (where K is a positive integer).

By reducing the processed bit number by 5 times (from 40 bits in $Q_R<1:40>$ to 8 bits in $Q'_R<1:8>$) the coordinated-determination device 197 not only facilitates the simplification of logic circuitry in the evaluator but also removes the possibility of the error due to the appearance of the fake transitions in other sections.

The multiplication arithmetic ($M \cdot N_{core}$) is implemented by an adder 194 that adds the output of 5-bit shifter 198 and 3-bit shifter 199. Because the number 40 is expressed as 101000 in binary format, and M is shifted by 3 bits and 5 bits respectively, and the two shifted numbers are added, the result is a 13-bit binary number for M·40. Finally, $Q_{Fin}$ will be determined by one more addition in adder 195 that adds M·40 and $Q_R$ to give a total of 14 bits.

Figure 11:
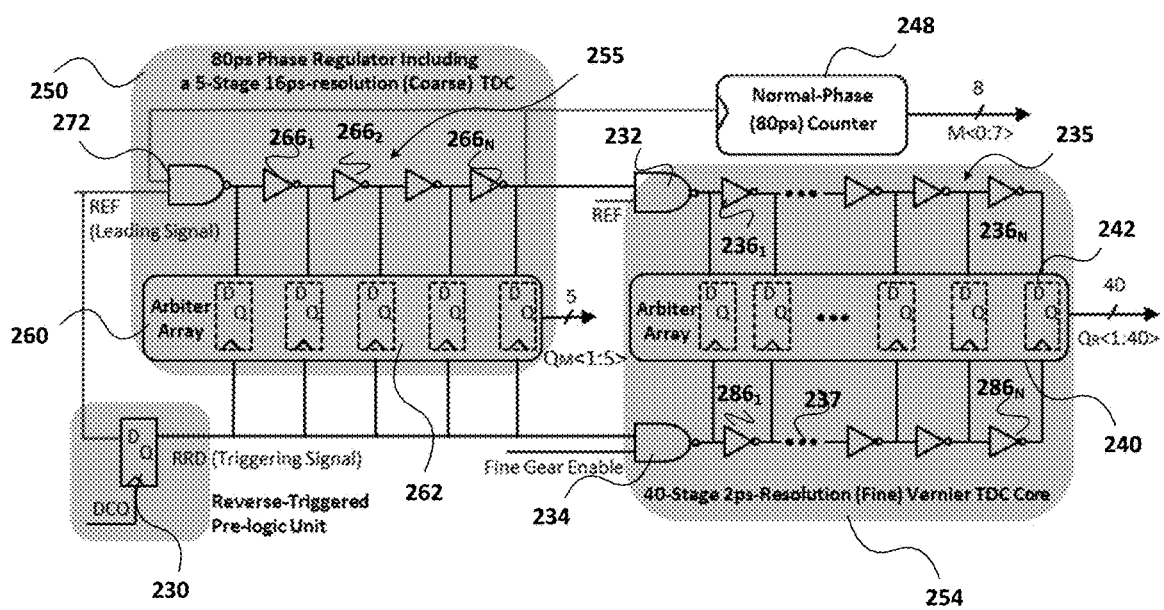
FIG. 11 is a schematic diagram of a third embodiment of the invention.

A still further embodiment is illustrated in FIG. 11. In this embodiment, which also employs RRD as the triggering signal, the phase regulator 250 is decoupled from the Vernier TDC core 254. This decoupling from the phase regulator circuitry and the fine TDC core circuitry makes the implementation easier. For example, in the embodiment of former architecture, $\tau_2$ has to be equal to $\Delta t_{ring}$ of 16 ps; while in the latter, $\tau_2$ can be set at 30 ps to reduce the area of the transistors in the TDC core circuit. This makes the device easier to implement and permits more flexibility in the management of the device parameters.

In the embodiment shown in FIG. 11, the phase regulator 250 comprises a chain 235 of delay elements comprising NAND gate 272 and inverters $266_1 \ldots 266_N$, and flip-flops 262. The phase regulator 250 comprises a 5-stage TDC core with 16 ps resolution structured as a typical ring oscillator. The normal-phase counter 248 counts the passes of the lead signal through the delay chain 255 and thus gives a measure of the time interval with a resolution of 80 ps. The arbiter array 260 operates as an inverter-based delay line and provides a 5-bit output, which increases the resolution to 16 ps. The arbiter 260 resolves the time to the particular flip-flop stage within each cycle of the ring structure as counted by the phase counter 248.

The separate Vernier TDC core 254 comprises delay chain 235 consisting of NAND gate 232 and inverter delay elements $236_1 \ldots 236_N$, and delay chain 237 NAND gate 234 and inverter delay elements $286_1 \ldots 286_N$. Arbiter array 240 comprises flip-flops 242.

As in the previous embodiments the pre-logic module generates the leading and triggering signals. The leading signal is applied to the phase regulator 250, and the number of loops that the leading signal passes through the chain 255 is counted by the normal-phase counter 248. The triggering signal is applied to the arbiter array 260 and to the input of the NAND gate 234 forming part of the 40-stage Vernier TDC core 254.

The normal-phase counter offers a resolution of 80 ps, namely the length of each cycle of the chain 255. The arbiter array acts as typical TDC and offers a resolution equal to the delay introduced by each stage, namely 16 ps. As in the FIG. 9 embodiment, the arbiter array 260 resolves the time measurement within each interval $T_{NOR}$ defined by the phase regulator 250 to a precision determined by the delay of the individual delay elements $266_1$ to $266_N$.

The output of the phase regulator 250 is applied to one input of the NAND gate 232 of the Vernier TDC core 254. The second input of the NAND gate 232 receives the leading signal from the pre-logic module 230. The triggering signal is also applied to an input of NAND gate 234, whose second input is an enable input.

The output of the chain 255 is applied to the input of chain 235. When an enable signal is asserted on the enable input of the NAND gate 234, the Vernier core 254 is activated and a 40-bit output with 2 ps resolution appears at the output of the arbiter array 240. The 40-bit word is taken from the Q-outputs of each flip-flop 242.

Because the phase regulator 250 is decoupled from the Vernier TDC core, this solution is easier to implement and offers a more flexible management of the device parameters. Embodiments of the invention offer a novel phase-scaled Vernier time-to-digital converter (TDC) architecture with a coarse/moderate/fine (80 ps/16 ps/2 ps) time resolution function is presented to achieve both large phase (time) detection range (32.7 ns in 14-bit) and fine time resolution (2 ps) as well as compact size and ultra-low power consumption simultaneously. The phase noise (caused by TDC) can also be improved allowing higher reference frequency compared to other types of TDC architectures. A phase-regulator has been created and embedded into a traditional Vernier TDC core circuitry for the purpose of separating a new-defined mandatory phase length (no longer than the normal-length phase, 80 ps) from the random phase (time) difference (up to 32 ns) to be measured. The mandatory phase length will be the only part for fine-resolution (2 ps) measurement and the rest of the phase length will be counted in coarse resolution (80 ps). The required number of stages of the traditional Vernier TDC core can be remarkably reduced from 6250 to 40 at a fixed 2 ps time resolution. Furthermore, compared to a typical Vernier ring TDC, the proposed architecture being combined with a reverse-triggered pre-logic unit and the coordinated-determination scheme facilitates a much simpler and faster determination procedure, which allows several times reduction of the power consumption as well as the raise of the reference frequency in order to achieve a 2-3 dB improvement of the phase noise performance.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A time-to-digital converter for determining a time interval $\Delta T_{Tot}$ between a leading signal and a triggering signal, comprising:
   a phase regulator incorporating a looped delay line to create pre-defined sub-intervals $T_{NOR}$ determined by the length of said delay line, said phase regulator having an input receiving said leading signal whereby said leading signal loops around said delay line;
   a counter arranged to count the number of times m said leading signal loops around said delay line before reception of said triggering signal to obtain a coarse measurement of said time interval defined in terms of said sub-intervals $T_{NOR}$; and
   a Vernier core determining a residual time interval $T_R$ where $T_R = \Delta T_{Tot} - mT_{NOR}$ to obtain a value for the time interval $\Delta T_{Tot}$,
   said Vernier core comprising:
      first and second of chains of delay elements, wherein each of the delay elements of said first chain introduces a first delay, and each of the delay elements of said second chain introduces a second delay different from said first delay,
      said first and second chains having respective inputs receiving said leading signal and said triggering signal whereby said leading signal and triggering signal propagate along said respective first and second chains with different delays, and
      a first arbiter for detecting coincidence between the respective signals in said first and second chains of delay elements to determine said residual time interval $T_R$.

2. A time-to-digital converter as claimed in claim 1, further comprising an evaluator responsive to outputs from said phase regulator, said counter, and said Vernier core to output said value for the time interval $\Delta T_{Tot}$.

3. A time-to-digital converter as claimed in claim 1, wherein a portion of said first chain of delay elements forms part of said phase regulator.

4. A time-to digital converter as claimed in claim 1, wherein said first and second chains of delay elements each comprise a NAND gate followed by a series of inverters, and said first arbiter comprises a series of flip-flops arranged between outputs of pairs of delay elements from each said chain.

5. A time-to digital converter as claimed in claim 1, wherein said phase regulator comprises a second arbiter coupled to a sub-set of said delay elements in said first chain, said sub-set of delay elements being looped in a ring structure.

6. A time-to digital converter as claimed in claim 5, wherein said first chain includes as a delay element a first NAND gate at the input to said sub-set of delay elements receiving at its inputs said leading signal and an output of said subset of delay elements, and a second NAND gate immediately downstream of said subset of delay elements receiving at its inputs the output of said sub-set of delay elements and the triggering signal.

7. A time-to digital converter as claimed in claim 5, wherein said triggering signal is a reference-retimed-by DCO (RRD) signal provided by a pre-logic module.

8. A time-to digital converter as claimed in claim 5, wherein said counter provides a coarse resolution output, said phase regulator provides a moderate resolution output, and said Vernier core provides a fine resolution output.

9. A time-to digital converter as claimed in claim 8, further comprising an evaluator responsive to outputs from said counter, said phase regulator, and said Vernier core to output the value for said time interval at a selected resolution.

10. A time-to digital converter as claimed in claim 1, wherein said phase regulator comprises an additional chain of delay elements receiving the leading signal, an output of said additional chain of delay elements being looped to an input thereof, said counter being arranged to count the number of passes of said additional chain of delay elements, and a second arbiter responsive to a triggering signal to provide a measurement of said time interval at moderate resolution, and said first chain having an input NAND gate with a first input receiving an output of said additional chain and a second input receiving said leading signal.

11. A time-to-digital converter as claimed in claim 10, wherein said second chain has an input NAND gate with a first input receiving said triggering signal and a second input receiving an enable signal.

12. A method of obtaining a digital representation of a time interval $\Delta T_{Tot}$ between a leading signal and a triggering signal in a time-to-digital converter comprising a phase regulator incorporating a looped delay line, and a counter; said method comprising:
   creating pre-defined sub-intervals $T_{NOR}$ with said looped delay line;
   looping said leading signal through said looped delay line until reception of said triggering signal;

counting in said counter the number of times m said leading signal loops around said delay line before reception of said triggering signal to obtain a coarse measurement of said time interval defined in terms of said sub-intervals $T_{NOR}$; and determining, in a Vernier core comprising first and second of chains of delay elements, wherein each of the delay elements of said first chain introduces a first delay, and each of the delay elements of said second chain introduces a second delay different from said first delay, residual time interval $T_R$ where $T_R = \Delta T_{Tot} - mT_{NOR}$, by applying said leading signal and said triggering signal to said first and second chains of delay elements, whereby said leading signal and triggering signal propagate along said respective first and second chains with different delays, and detecting in a first arbiter coincidence between the respective signals in said first and second chains of delay elements to determine said residual time interval $T_R$ and thereby a value for the time interval $\Delta T_{Tot}$.

13. A method as claimed in claim 12, further comprising evaluating the outputs from said looped delay line, said counter, and said Vernier core to output said value for the time interval $\Delta T_{Tot}$.

14. A method as claimed in claim 12, further comprising looping said leading signal through a portion of said first chain of delay elements forming said looped delay line.

15. A method as claimed in claim 14, further comprising asserting an enable signal at an input of said second chain of delay elements upon reception of said triggering signal.

16. A method as claimed in claim 12, further comprising obtaining a coarse measurement of said time interval from the number of times said leading signal loops around a sub-set of said delay elements in said first chain, a moderate resolution measurement from a second arbiter coupled to said sub-set of delay elements, and a fine resolution measurement from said first arbiter.

17. A method as claimed in claim 16, further comprising applying said leading signal to a first input of a first NAND gate at the input to said sub-set of delay elements and an output of said sub-set to a second input of said first NAND gate, and applying the output of said sub-set of delay elements and said triggering signal to respective inputs of a second NAND gate immediately downstream of said subset of delay elements.

18. A method as claimed in claim 17, wherein said triggering signal is a reference-retimed-by DCO (RRD) signal.

19. A method as claimed in claim 12, further comprising applying the leading signal to an additional chain of delay elements, and the triggering signal to a n additional arbiter, looping an output of additional chain of delay elements to an input thereof, counting the number of passes of said additional chain of delay elements before the detection of said triggering signal, applying said triggering signal to said additional arbiter to obtain a measurement of said time interval at moderate resolution, and comprising applying an output of said additional chain to a first input of a NAND gate at the input of said first chain and said leading signal to a second input of said input NAND gate.

20. A method as claimed in claim 19, further comprising applying said triggering signal to an enable input of a NAND gate at the input of said second chain and an enable signal to a second input of said NAND gate at the input of said second chain.

* * * * *